United States Patent
Haji-Sheikh et al.

(10) Patent No.: US 6,831,458 B2
(45) Date of Patent: Dec. 14, 2004

(54) MAGNETIC DIFFERENTIAL FIELD SENSOR USING HYSTERESIS FIELD IN AMR FILMS

(75) Inventors: Michael J. Haji-Sheikh, De Kalb, IL (US); Ronald W. Chandler, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 225 days.

(21) Appl. No.: 10/277,037

(22) Filed: Oct. 21, 2002

(65) Prior Publication Data

US 2004/0075430 A1 Apr. 22, 2004

(51) Int. Cl.⁷ .............................................. G01R 33/09
(52) U.S. Cl. ...................................................... 324/252
(58) Field of Search ................................ 324/244, 249, 324/252; 360/324–327

(56) References Cited

U.S. PATENT DOCUMENTS

| | | |
|---|---|---|
| 5,667,879 A | 9/1997 | Haji-Sheikh |
| 6,025,979 A | 2/2000 | Yamane et al. ............. 360/113 |
| 6,184,679 B1 | 2/2001 | Popovic et al. |
| 6,433,545 B1 | 8/2002 | Kunze et al. ............... 324/252 |

Primary Examiner—Bot LeDynh
(74) Attorney, Agent, or Firm—Kris T. Fredrick; Kermit D. Lopez; Luis M. Ortiz

(57) ABSTRACT

A method and system for detecting a magnetic field utilizing a magnetoresistor of a magnetic sensor is disclosed. A normalized magnetoresistance associated with the magnetoresistor can be calculated such that the magnetoresistor comprises an initial magnetization direction thereof. The magnetic field is generally permitted to exceed an ability of the magnetoresistor to remain pointed in the initial magnetization direction, thereby enabling the magnetoresistor to experience a magnetization reversal thereof. The normalized resistance can be placed into a new state in response to the magnetization reversal thereof, thereby permitting the normalized resistance to be utilized as a switch thereof and allowing the magnetic sensor to detect changes in the magnetic field associated with the magnetoresistor.

23 Claims, 3 Drawing Sheets

MAGNETIC DIFFERENTIAL FIELD SENSOR USING HYSTERESIS FIELD IN AMR FILMS

TECHNICAL FIELD

The present invention is generally related to magnetic sensors. The present invention is also related to anisotropic magneto-resistance (AMR) sensors. The present invention is also related to sensors utilized in automotive applications. Additionally, the present invention is related to magnetoresistors utilized in magnetic sensor devices.

BACKGROUND OF THE INVENTION

Magnetoresistors are often utilized for the contactless detection of changes in state, such as the measurement of an angular position of a rotatably mounted part. Magnetoresistive-based sensors typically include magnetic field-dependent resistors, which are arranged in a bridge circuit configuration and through which a control current is fed. When a magnetoresistive-based sensor is influenced by a magnetic field, a voltage can be established in which the magnitude of the voltage depends on the magnitude and direction of the magnetic field associated with the sensor.

The relationship between an associated bridge circuit voltage and the magnetic field direction can be utilized in a contactless AMR (Anisotropic Magneto Resistive) sensor, for example, to detect the angular position of a rotatably mounted part. Such sensors are particularly useful in automotive applications. If precise measurement is to be possible at all, a zero point must first be defined, or a calibration of the sensor must be performed. AMR sensors are typically configured from an AMR film that is formed from a magnetic substance that exhibits a magnetoresistive effect and generally possesses a single-layered structure.

A magneto-resistive sensor (e.g., AMR sensor) may be acted upon by a magnetic field oriented in a particular manner, such that a definite control current can be applied to the current contacts of an associated bridge circuit. The voltage that is then established at the other contacts can be measured on an ongoing basis. In general, the serpentine pattern of magnetoresistive material utilized in magnetic sensors such as AMR sensors can be connected electrically in a Wheatstone bridge arrangement in order to sense changes in the resistance of the magnetoresistive material in response to changes in the strength of a magnetic field component in the plane of the magnetoresistive elements. In order to monitor the changes in the resistance of the material, associated components, such as amplifiers, are generally connected together to form an electrical circuit, which provides an output signal that is representative of the strength of the magnetic field in the plane of the sensing elements. When the circuit is provided on a silicon substrate, electrical connections between associated components can be made above the surface of the silicon or by appropriately doped regions beneath the components and within the body of the silicon substrate. Components can be connected to each other above the surface of the silicon by disposing conductive material to form electrically conductive paths between the components. When appropriately doped regions within the silicon substrate connect components in electrical communication with each other, an electrically conductive path can be formed by diffusing a region of the silicon with an appropriate impurity, such as phosphorous, arsenic or boron to form electrically conductive connections between the components.

An AMR sensor can be processed with the aid of a laser until such time as the offset voltage, when no magnetic field is applied, becomes equal to zero. Such magneto-resistive sensors are thus ideally suited for angular position applications and for use as angular position sensors. AMR sensors and magnetoresistor-based devices are thus well known in the art. An example of a magnetic sensor configuration is depicted in U.S. Pat. No. 5,667,879, "TaN/NiFe/TaN an isotropic magnetic sensor element," to Michael J. Haji-Sheikh, which is incorporated herein by reference. U.S. Pat. No. 5,667,879 discloses a stack of two refractory nitride layers and a magnetoresistive layer used to facilitate electrical connection between components of a sensor. The stack of tantalum nitride and nickel iron layers are disposed over a silicide layer that is, in turn, disposed on a diffusion of conductive material within the body of a silicon layer. A titanium tungsten layer is disposed on the stack and below a subsequent layer of a conductive metal such as aluminum. A silicon nitride passivation layer is disposed over all of the other layers.

AMR films associated with AMR sensors fundamentally respond differently to what is referred to in the art as an "easy" axis and a "hard" axis. An AMR sensor, which essentially senses a cross axis field, does not possess any basic hysteresis effect and will exhibit a maximum change in resistance as high 2% to 4%. These types of sensors are commonly utilized in a variety of sensing applications, including automotive applications thereof. It has been demonstrated in the art that a resistor (i.e., magnetoresistor) that is actuated with a field along the easy axis will experience a slight increase in resistance and that the same resistor actuated against the easy axis vector has a marked decrease in resistance (e.g., up to 1.2%), until the resistor reaches its desired switching field.

When the switching field is attained, the change in resistance may rise to a slightly positive change in resistance. This change in the switching field is associated with magnetization reversal. The phenomenon of magnetization reversal has been observed for years in ferromagnetic material. This effect has been considered a nuisance to be designed around. The present inventors have discovered, however, that this phenomenon can actually be utilized in a manner that offers advantages for magnetic sensing capabilities thereof. The invention described herein takes advantage of this phenomenon and discloses a unique method for achieving magnetic sensing capabilities thereof.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide an improved magnetic sensor.

It is another aspect of the present invention to provide an improved AMR sensor.

It is an additional aspect of the present invention to provide a method and system for detecting a magnetic field utilizing a magnetoresistor associated with a magnetic sensor.

It is yet another aspect of the present invention is to provide a method and system for detecting a magnetic field using the ability of the internal magnetization permalloy to reverse direction.

The above and other aspects of the invention can be achieved as is now described. A method and system for detecting a magnetic field utilizing a magnetoresistor of a magnetic sensor are described herein. A magnetoresistance associated with the magnetoresistor can be calculated such that the magnetoresistor comprises an initial magnetization direction thereof. The magnetic field is generally permitted to exceed an ability of the magnetoresistor to remain pointed in the initial magnetization direction, thereby enabling the magnetoresistor to experience a magnetization reversal thereof. The normalized resistance can be placed into a new state in response to the magnetization reversal thereof, thereby permitting the normalized resistance to be utilized as a switch thereof and allowing the magnetic sensor to detect changes in the magnetic field associated with the magnetoresistor.

The normalized resistance is generally altered in response to a change in the magnetic field. The magnetic field generally comprises a one-dimensional zero crossing magnetic field. Additionally, a switching field is associated with the magnetization reversal thereof. The magnetic field associated with the magnetoresistor also comprises a sinusoidally varying field. The sinusoidally varying field can be converted into a pulse train, such that a value of the switching field, which produces the pulse train thereof, is dependent on a geometry of the magnetoresistor.

A differential Wheatstone bridge circuit can be associated with the magnetic sensor, such that the differential Wheatstone bridge circuit produces an output in the form of a pulse train. The differential Wheatstone bridge includes one or more comparators and one or more D-flip-flop circuits, which together can generate a digital representation of the magnetic field. The magnetic field itself can be expressed as a one-dimensional zero crossing magnetic field. The magnetic sensor is generally configured as a permalloy sensor, including an AMR sensor. The normalized resistance is thus utilized as a switch until identifying a change in the normalized resistance.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
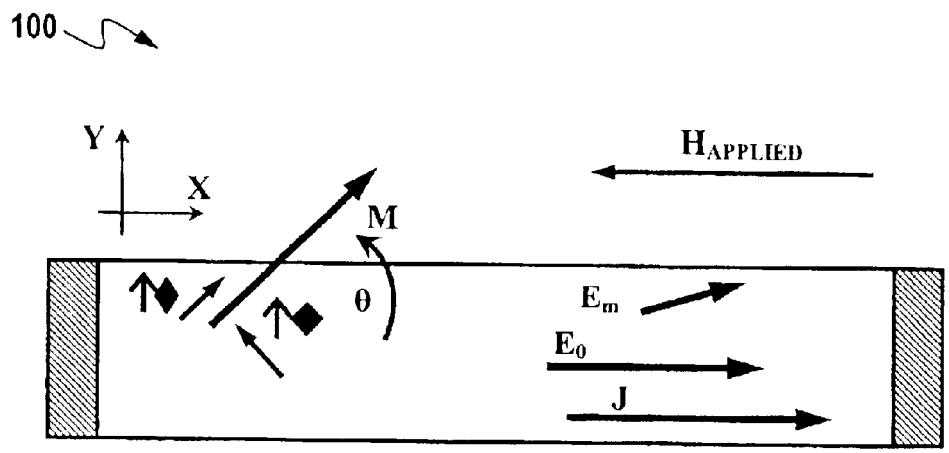
FIG. 1 depicts a schematic diagram of a magnetoresistor, which may be utilized in associated with the present invention.

FIG. 1 depicts a schematic diagram of a magnetoresistor 100, which may be utilized in a preferred embodiment of the present invention. FIG. 1 depicts a schematic of a typical magnetoresistor having a magnetization thereof, which is represented by the variable M. Magnetization M is dependent on thickness, width and length as design parameters. FIG. 1 illustrates a classic model with the field applied opposite to the direction of the magnetization. Electric field vectors are represented by the variables $E_m$ and $E_0$. Additionally, the variable J represents the current density. The variable $\theta$ represents the angle between M and J. Magnetoresistor 100 also possesses a resisitivity, which is typical of magnetoresistor devices.

Magnetoresistor 100 is presented herein for illustrative and edification purposes only. The particular values and parameters of magnetoresistor 100 are not considered limiting features of the present invention. Those skilled in the art can thus appreciate that variations to magnetoresistor 100 may be implemenented in accordance with one or more preferred or alternative embodiments of the present invention.

Figure 2:
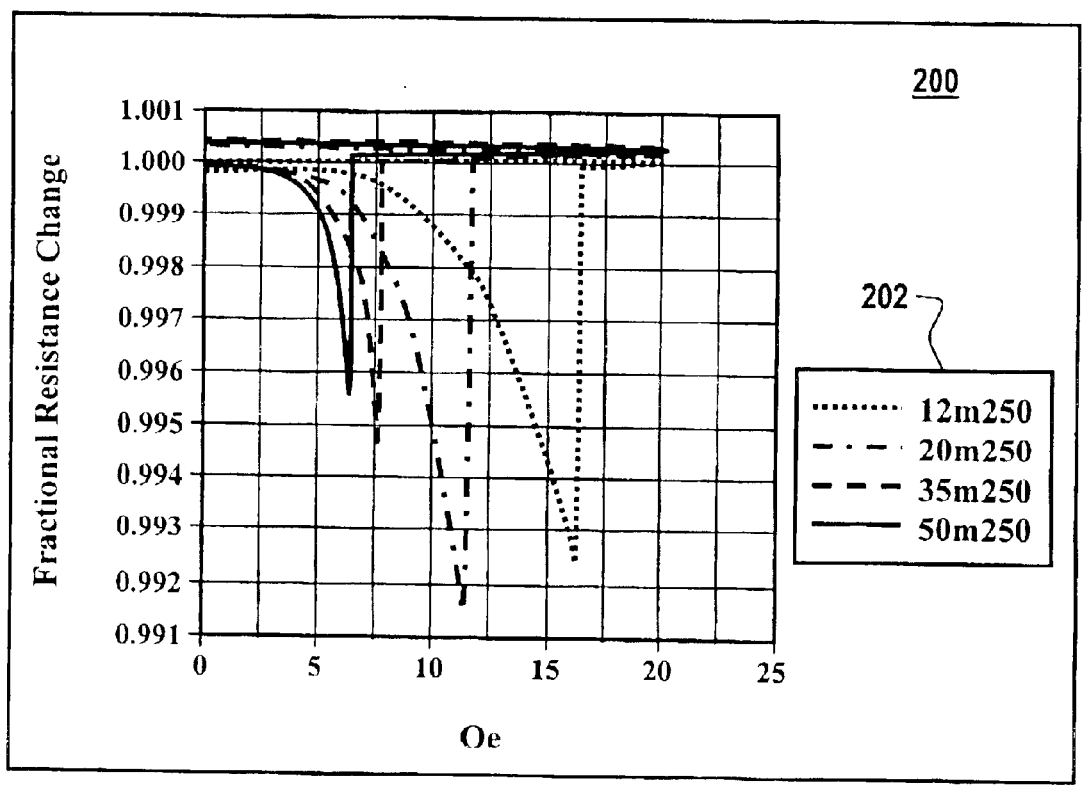
FIG. 2 depicts a graph illustrating the normalized resistance of a permalloy sensor utilized as a switch in accordance with the present invention.

FIG. 2 depicts a graph 200 illustrating the normalized resistance of a permalloy sensor utilized as a switch in accordance with a preferred embodiment of the present invention. The phenomenon of magnetization reversal has been observed for years in ferromagnetic material. This effect has been considered a nuisance to be designed around. In accordance with the method and system of the present invention, however, magnetization reversal is used as a magnetic equivalent to a Schmidt trigger. A Schmidt trigger is an electrical device, which exhibits a voltage hysteresis, thereby enhancing noise rejection. A Schmidt trigger generally incorporates an operational amplifier with positive feedback to create a step function in the output at a predetermined value of the input signal. Graph 200 generally illustrates a demonstration of the resistance change as a function of field level for a particular thickness film. Note that legend 202 depicted in FIG. 2 illustrates line indicators displayed within graph 200.

The magnetization reversal occurs when a magnetic field exceeds the ability for the magnetization to remain pointed in the original direction. The normalized magnetoresistance for such a resistor, as shown in FIG. 2, can change as much as 0.8% prior to the reversal process. The value of the magnetic field when this occurs varies with geometry.

Figure 3:
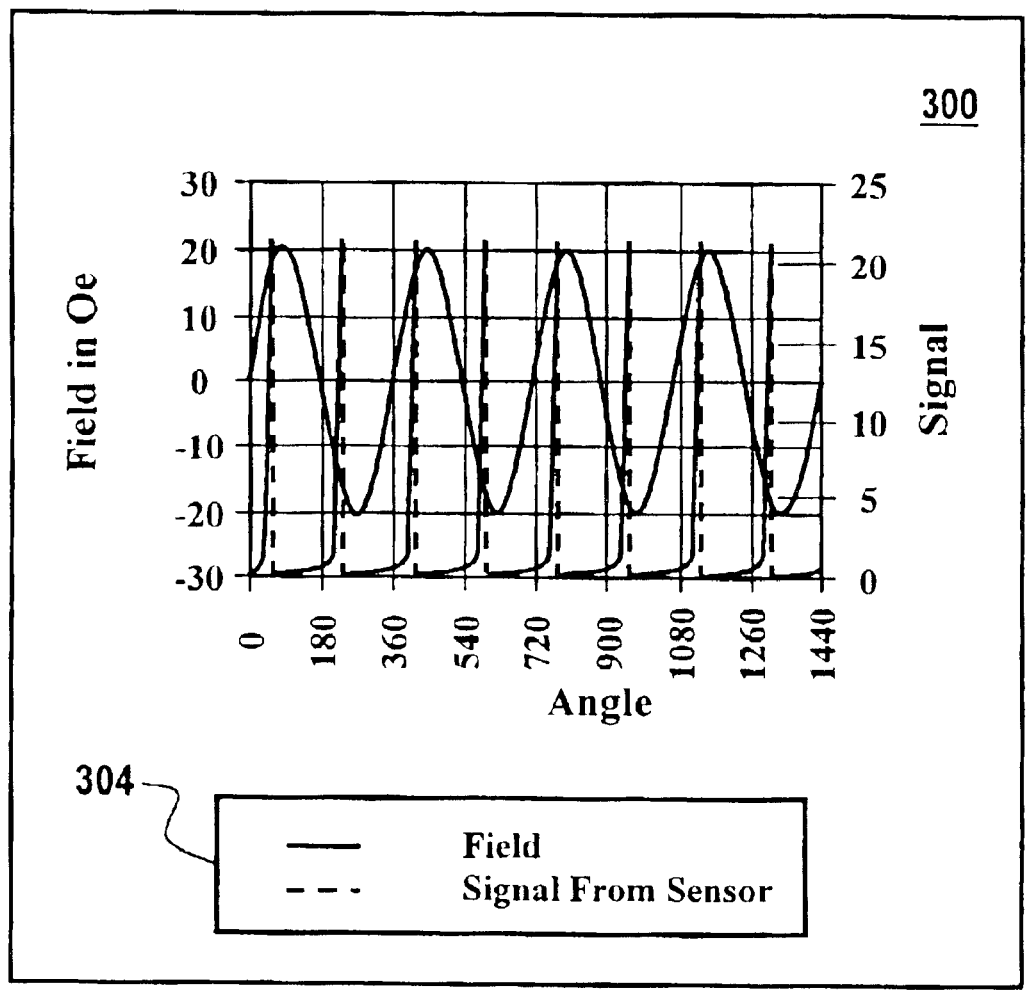
FIG. 3 depicts a graph illustrating a magnetic signal and a predicted output of a zero crossing sensor using magnetization reversal in accordance with the present invention.

FIG. 3 depicts a graph 300 illustrating a magnetic signal and a predicted output of a zero crossing sensor using magnetization reversal in accordance with the present invention. The sensor associated with the results indicated in graph 300 produces a pulse every 180 degrees. Note that legend 302 depicted in FIG. 3 illustrates line indicators displayed within graph 300. The magnetic stimulus shown is sinusoidal and centered around a zero magnetic field. The peak values exceed the threshold values inherent in the design of the present invention. Note that a pulse is generated in the output each time that the magnetization passes through the threshold, but only after a reversal in the applied magnetic field. This characteristic produces an output that is immune to noise in the forcing field less than the hysteresis of the device.

Figure 4:
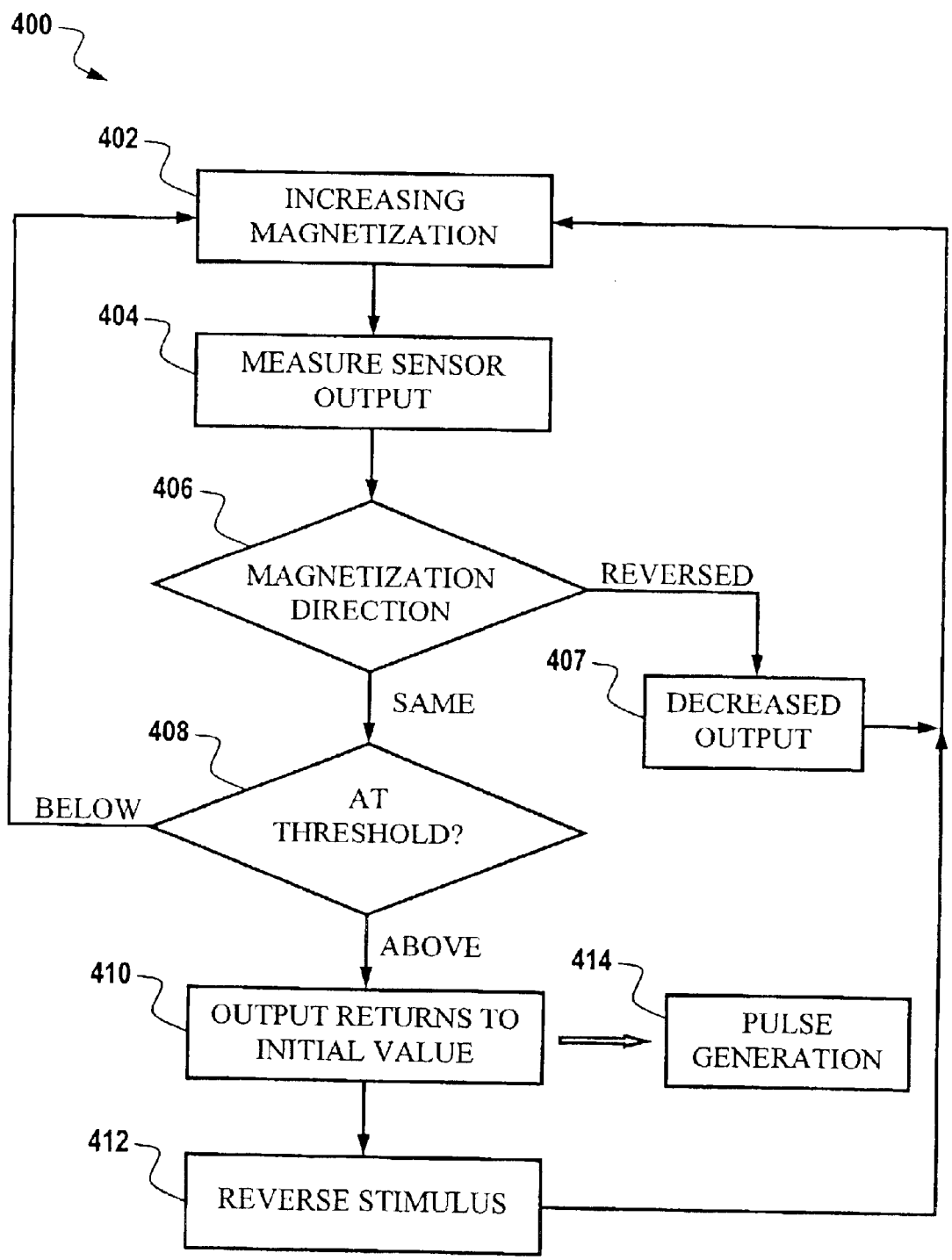
FIG. 4 depicts a high-level flow chart of operations illustrating logical operational steps implemented in accordance with the present invention.

FIG. 4 depicts a high-level flow chart 400 of operations illustrating logical operational steps which can be implemented in accordance with the present invention. FIG. 4 generally illustrates a methodology for detecting a one-dimensional zero crossing magnetic field using the ability of the internal magnetization in a permalloy to reverse direction in accordance with the present invention. Note that an example of such a magnetization is illustrated in FIG. 1 via magnetization M. Flow chart 400 thus describes a method for detecting a magnetic field and for implementing a zero crossing magnetic sensor.

As illustrated at block 402, magnetization is generally increased. Thereafter, as indicated at block 404, output from a magnetic sensor can be measured. Next, at decision block 406, the magnetization is either reversed or remains the same. If the magnetization direction is reversed, then as illustrated at block 407, output from the sensor is decreased and the process illustrated at block 402 is repeated. Note that as indicated herein, magnetization reversal occurs when the magnetic field associated with the magnetoresistor "bucks" or exceeds the ability for the magnetoresistance of the magnetoresistor to remain pointed in the original or initial direction. If the magnetization direction does not change and thus remains the constant, then as illustrated at decision block 408, a decision is made to determine whether or not a threshold has been attained. If a value is located below the threshold, then the operation depicted at block 402 is repeated. If, however, the value is located at or above the threshold, then the operation illustrated at block 410 is processed.

As indicated at block 410, the output returns to its initial value and as indicated at block 414, pulse generation occurs. Pulse generation occurs in the form of an exponential pulse train (i.e., each pulse has an exponential shape), which is generated as output from a differential Wheatsone bridge circuit. Such a Wheatstone bridge circuit can be coupled to a comparator and a D-flip-flop to create a digital representation of the zero crossing field described herein. Following processing of the operation depicted at block 410, a reverse stimulus occurs, as indicated at block 412, and thereafter the operation described at block 402 is repeated.

Following processing of the operation described at block 406, the normalized resistance can be automatically placed into a new state in response to the magnetization reversal thereof, thereby permitting the normalized resistance to be utilized as a switch thereof and allowing the magnetic sensor to detect changes in the magnetic field associated with the magnetoresistor. The normalized magnetoresistance associated with the magnetoresistance can thus be calculated and utilized as a switch. The normalized resistance can change in accordance with the magnetic field until the normalized resistance attains a switch point. An example of this phenomenon was illustrated and described previously with respect to FIG. 2. Note that the value of the magnetic field varies with respect to the geometry (e.g., length, width, etc.) of the magnetoresistor. The normalized resistance can then return to its original or initial value. The normalized resistance is then set or placed into a new state until the field reverses direction again.

Based on the foregoing, it can thus be appreciated that a method and system for detecting a magnetic field utilizing a magnetoresistor of a magnetic sensor are described herein.

The normalized magnetoresistance associated with the magnetoresistor can be calculated such that the magnetoresistor comprises an initial magnetization direction thereof. The magnetic field is generally permitted to exceed an ability of the magnetoresistor to remain pointed in the initial magnetization direction, thereby enabling the magnetoresistor to experience a magnetization reversal thereof. The normalized resistance can be placed into a new state in response to the magnetization reversal thereof, thereby permitting the normalized resistance to be utilized as a switch thereof and allowing the magnetic sensor to detect changes in the magnetic field associated with the magnetoresistor.

The normalized resistance is generally altered in response to a change in the magnetic field. The magnetic field generally comprises a one-dimensional zero crossing magnetic field. Additionally, a switching field is associated with the magnetization reversal thereof. The magnetic field associated with the magnetoresistor also comprises a sinusoidally varying field. The sinusoidally varying field can be converted into a pulse train, such that a value of the switching field, which produces the pulse train thereof, is dependent on a geometry of the magnetoresistor.

A differential Wheatstone bridge circuit can be associated with the magnetic sensor, such that the differential Wheatstone bridge circuit produces an output comprising the pulse train. Such a differential Wheatstone bridge circuit can be configured to comprise at least one comparator and at least one D-flip-flop circuit to create a digital representation of the magnetic field, such that the magnetic field comprises a one-dimensional zero crossing magnetic field. The magnetic sensor can be generally configured as a permalloy sensor, including an AMR sensor. The normalized resistance is thus utilized as a switch until identifying a change in the normalized resistance.

Several advantages can be obtained by implementing the method and system of the present invention within the context of a magnetic sensor configuration. For example, the present invention relies upon the magnetization reversal phenomenon in a manner that eliminates hysteresis components in associated magnetic sensor integrated circuits, which in turn can also lower the overall current required by such integrated circuits. Note that as utilized herein, the term "hysteresis" refers generally to the lagging of an effect behind its cause, as when, for example, a magnetic body is subjected to a varying force, or when a body is subjected to stress, or additionally, when an electric substance is subjected to a changing intensity. Another advantage of the present invention stems from the fact the zero crossing magnetic sensor described herein does not require the use of one or more Hall cells to measure the direction of magnetization, because this direction can be detected externally. The present invention thus utilizes the change in resistance of the magnetoresistive material itself.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for detecting a magnetic field utilizing a magnetoresistor of a magnetic sensor, said method comprising the steps of:
  calculating a normalized magnetoresistance associated with said magnetoresistor, wherein said magnetoresistor comprises an initial magnetization direction thereof;
  permitting said magnetic field to exceed an ability of said magnetoresistor to remain pointed in said initial magnetization direction, thereby enabling said magnetoresistor to experience a magnetization reversal thereof; and
  placing said normalized resistance into a new state in response to said magnetization reversal thereof, thereby permitting said normalized resistance to be utilized as a switch thereof and allowing said magnetic sensor to detect changes in said magnetic field associated with said magnetoresistor.

2. The method of claim 1 further comprising the step of altering said normalized resistance in response to a change in said magnetic field.

3. The method of claim 1 wherein said magnetic field comprises a one-dimensional zero crossing magnetic field.

4. The method of claim 1 further comprising the step of identifying a switching field associated with said magnetization reversal thereof.

5. The method of claim 4 wherein said magnetic field associated with said magnetoresistor comprises a sinusoidally varying field.

6. The method of claim 5 further comprising the step of converting said sinusoidally varying field into a pulse train, such that a value of said switching field, which produces said pulse train thereof, is dependent on a geometry of said magnetoresistor.

7. The method of claim 6 further comprising the steps of associating a differential Wheatstone bridge circuit with said magnetic sensor, such that said differential Wheatstone bridge circuit produces an output comprising said pulse train.

8. The method of claim 7 further comprising the step of configuring said differential Wheatstone bridge circuit to comprise at least one comparator and at least one D-flip-flop circuit to create a digital representation of said magnetic field, such that said magnetic field comprises a one-dimensional zero crossing magnetic field.

9. The method of claim 1 wherein said magnetic sensor comprises a permalloy sensor.

10. The method of claim 1 wherein said magnetic sensor comprises an AMR sensor.

11. A method for detecting a magnetic field utilizing a magnetoresistor of a magnetic sensor, said method comprising the steps of:
  calculating a normalized magnetoresistance associated with said magnetoresistor, wherein said magnetoresistor comprises an initial magnetization direction thereof;
  permitting said magnetic field to exceed an ability of said magnetoresistor to remain pointed in said initial magnetization direction, thereby enabling said magnetoresistor to experience a magnetization reversal thereof;
  altering said normalized resistance in response to a change in said magnetic field, wherein said magnetic field comprises a one-dimensional zero crossing magnetic field;
  placing said normalized resistance into a new state in response to said magnetization reversal thereof, thereby permitting said normalized resistance to be utilized as a switch thereof and allowing said magnetic sensor to detect changes in said magnetic field associated with said magnetoresistor; and
  identifying a switching field associated with said magnetization reversal thereof.

12. A magnetic sensor for detecting a magnetic field, said magnetic sensor comprising:
  a magnetoresistor comprising an initial magnetization direction thereof, such that a normalized magnetoresistance associated with said magnetoresistor is calculable thereof;
  a magnetic field altering mechanism which permits said magnetic field to exceed an ability of said magnetoresistor to remain pointed in said initial magnetization direction, thereby enabling said magnetoresistor to experience a magnetization reversal thereof; and
  wherein said normalized resistance is placed into a new state in response to said magnetization reversal thereof, thereby permitting said normalized resistance to be utilized by the magnetic sensor as a switch thereof and allowing the magnetic sensor to detect changes in said magnetic field associated with said magnetoresistor.

13. The system of claim 12 wherein said normalized resistance is alterable in response to a change in said magnetic field.

14. The system of claim 12 wherein said magnetic field comprises a one-dimensional zero crossing magnetic field.

15. The system of claim 12 further comprising a detector for identifying a switching field associated with said magnetization reversal thereof.

16. The system of claim 15 wherein said magnetic field associated with said magnetoresistor comprises a sinusoidally varying field.

17. The system of claim 16 further comprising a converter for converting a sinusoidally varying field into a pulse train, such that a value of said switching field, which produces said pulse train thereof, is dependent on a geometry of said magnetoresistor.

18. The system of claim 17 wherein a differential Wheatstone bridge circuit is associated with said magnetic sensor, such that said differential Wheatstone bridge circuit produces an output comprising said pulse train.

19. The system of claim 18 wherein said differential Wheatstone bridge circuit comprises at least one comparator and at least one D-flip-flop circuit to create a digital representation of said magnetic field, such that said magnetic field comprises a one-dimensional zero crossing magnetic field.

20. The system of claim 12 wherein said magnetic sensor comprises a permalloy sensor.

21. The system of claim 12 wherein said magnetic sensor comprises an AMR sensor.

22. A magnetic sensor for detecting a magnetic field, said magnetic sensor comprising:
  a magnetoresistor comprising an initial magnetization direction thereof, such that a normalized magnetoresistance associated with said magnetoresistor is calculable thereof;
  a magnetic field altering mechanism which permits said magnetic field to exceed an ability of said magnetoresistor to remain pointed in said initial magnetization direction, thereby enabling said magnetoresistor to experience a magnetization reversal thereof;
  wherein said normalized resistance is alterable in response to a change in said magnetic field, such that said magnetic field comprises a one-dimensional zero crossing magnetic field;

wherein said magnetic field associated with said magnetoresistor comprises a sinusoidally varying field; and wherein said normalized resistance is placed into a new state in response to said magnetization reversal thereof, thereby permitting said normalized resistance to be utilized as a switch thereof and allowing said magnetic sensor to detect changes in said magnetic field associated with said magnetoresistor.

23. A sensor for detecting a magnetic field, said sensor comprising:

a permalloy magnetoresistor comprising an initial magnetization direction thereof, such that a normalized magnetoresistance associated with said permalloy magnetoresistor is calculable thereof;

a magnetic field altering mechanism that permits said magnetic field to exceed an ability of said permalloy magnetoresistor to remain pointed in said initial magnetization direction, thereby enabling said permalloy magnetoresistor to experience a magnetization reversal thereof;

a converter for converting a sinusoidally varying field into a pulse train; and wherein said normalized resistance is automatically placed into a new state in response to said magnetization reversal thereof, thereby permitting said normalized resistance to be utilized as a switch thereof which permits said sensor to detect changes in said magnetic field associated with said magnetoresistor via said pulse train.

* * * * *